United States Patent
Quarre et al.

[11] Patent Number: 5,831,443
[45] Date of Patent: Nov. 3, 1998

[54] PROBE CARD ARRAY CHECK PLATE WITH TRANSITION ZONES

[75] Inventors: Steven C. Quarre, Redmond; John P. Stewart, Seattle, both of Wash.

[73] Assignee: Applied Precision, Inc., Issaquah, Wash.

[21] Appl. No.: 658,659

[22] Filed: Jun. 5, 1996

[51] Int. Cl.$^6$ ............................................. G01R 31/02
[52] U.S. Cl. ........................... 324/758; 324/158.1
[58] Field of Search ................................ 324/758, 158.1, 324/697, 754, 757, 755; 382/152, 141, 8, 34; 29/827, 846, 850; 439/482, 824

[56] References Cited

U.S. PATENT DOCUMENTS

| | | | |
|---|---|---|---|
| 4,918,374 | 4/1990 | Stewart et al. | 324/73.1 |
| 5,065,092 | 11/1991 | Sigler | 324/758 |
| 5,198,756 | 3/1993 | Jenkins et al. | 324/757 |
| 5,508,629 | 4/1996 | Stewart et al. | 324/758 |
| 5,561,377 | 10/1996 | Strid et al. | 324/754 |
| 5,657,394 | 8/1997 | Schwartz et al. | 382/151 |
| 5,659,255 | 8/1997 | Strid et al. | 324/754 |

*Primary Examiner*—Vinh P. Nguyen
*Attorney, Agent, or Firm*—Richardson & Folise

[57] ABSTRACT

A probe card array check plate is provided with transition zones to prevent a semi-conductor probe from impacting an epoxy joint in the check plate during an over travel test. The transition zone is in the form of beveled edges or tapers between first and second testing surfaces. In alternate embodiments, two or more different types of testing surfaces are juxta positioned, or an optical measurement window is made sufficiently large to prevent an over traveling probe tip from entering an epoxied area.

21 Claims, 4 Drawing Sheets

PROBE CARD ARRAY CHECK PLATE WITH TRANSITION ZONES

TECHNICAL FIELD

The invention relates to equipment for testing physical and electrical characteristics of integrated circuit probe card arrays. More specifically, the invention relates to check plates used in the testing of integrated circuit probe card arrays.

BACKGROUND OF THE INVENTION

A variety of equipment and techniques have been developed to assist manufacturers of integrated circuits in testing those circuits while still in the form of dies on semi-conductor wafers. In order to quickly and selectively electrically interconnect contact pads on each die to the electrical test equipment, arrays of slender wires are arranged on conventional printed circuit boards so as to be positionable on the metalized contact pads associated with each semi-conductor die. As is well known by those of ordinary skill in the art, those printed circuit test cards have come to be known as "probe cards".

As the circuit density of integrated semi-conductor circuits has increased, the number of pads associated with each die has increased. It is now not uncommon for a single die to have upwards of 400 to 500 pads electrically associated with each die. The metalized pads themselves may have as little as one $\mu$m gap therebetween with an on-center spacing on the order of 6- to 7-thousandths of an inch. As a result, the slender probe wires of the probe array cards have become much more densely packed. It is highly desirable that the free ends or "points" of the probes be aligned in a common horizontal plane, as well as have the proper horizontal positioning with respect to one another within the plane so that when the probes are pressed down onto the metalized pads of an integrated circuit die, the probes touch down substantially simultaneously, and with equal force while being on target. In the process of touching down the probes, the probes themselves deflect from their rest position. This movement is termed "scrub" and must be taken into account in determining whether the rest position of the probes is within specification for the probe card.

The assignee of the present invention has developed equipment for testing the electrical characteristics, planarity and horizontal alignment, as well as scrub characteristics of various probe card arrays and sells such equipment under in its Precision Point™ line of probe card array testing and rework stations. A significant component of these stations is a planar working surface known as a "check plate". A check plate simulates the semi-conductor die undergoing a test by a probe card while checking the above described characteristics of the probes. A suitable check plate for use with the assignee's Precision Point™ equipment is described in detail in U.S. Pat. No. 4,918,379 issued Apr. 17, 1990, the disclosure of which is incorporated herein by reference. It is sufficient for the purposes of this disclosure to reiterate that while the subject probe card is held in a fixed position the check plate is moved both vertically and horizontally in steps when testing the horizontal relative positioning, and travel or "scrub" of each probe tip. Previously, and as described in the above-identified patent, horizontal position information for each probe tip was determined by translating an isolated probe tip in steps across resistive discontinuities on the check plate. In recent years, this technique has been altered by placing a transparent, optical window in the surface contact plane of the check plate with a sufficiently large surface dimension so as to permit a probe tip to reside thereon. An electronic camera viewing the probe tip through the window digitizes the initial touch down image of the probe, and a displaced position of the probes due to "scrub" as the check plate is raised to "over travel" the probe. The initial touch down position is compared to the anticipated touch down position to assist an operator in realigning that particular probe.

The assignee of the present invention has developed a complementary, conductive post electrically insulated from the surrounding check plate so as to electrically isolate a single probe from other probes which might be electrically connected or "bussed" to the same probe. In this way, electrical resistivity and impedance tests can be performed on each isolated probe.

Both the optical window and the isolated conductive post have respective contact surfaces which are substantially planar with the contact surface of the check plate when assembled. However the interface between the check plate contact surface and the insulated conductive post and/or optical window can develop certain discontinuity problems in terms of planarity with use. Specifically, the optical window, conductive post, and electrically insulating collar which surrounds the post are embedded into the check plate with an ultra violet light cured epoxy. Although the contact surface of the check plate including the electrical post and insulating collar are all aligned, lapped and polished to within approximately 11-millionths of an inch in planarity, the epoxy joints can chip over time. Thus, particularly when testing a probe which has substantially deviated from its intended horizontal position it is possible that after touch down and during the scrubbing action, the probe tip can enter the epoxied junction between the check plate and optical window, insulating collar and/or conductive post which may have become chipped. If the probe becomes caught on this discontinuity during the scrubbing action, the probe can be damaged.

Therefore, a need exists for a probe card array check plate which avoids catching a probe card tip in discontinuities between different testing devices on the check plate.

SUMMARY OF THE INVENTION

It is therefore an object of the present invention to provide a probe card array check plate which avoids introducing a probe tip across any discontinuities in an epoxy joint between a main body of the check plate and an ancillary or secondary testing device of the check plate.

The invention achieves this object, and other objects and advantages which will become apparent from the description which follows, by providing one or more transition zones between the main body of the check plate, and any secondary or tertiary testing device on the surface of the check plate. In one preferred embodiment of the invention, the transition zone comprises a series of cooperative beveled edges, tapered portions or tapers on a portion of the check plate defining an aperture for receiving another test device such as an optical window, or an electrically isolated, conductive post. The cooperative bevel or taper preferably has a depth and length sufficient in relationship to the known range of diameters of conventional probes to prevent an over travelled probe during a scrub test from coming into contact with an epoxy joint between the check plate and the secondary testing device with excessive force.

In an alternate embodiment of the invention, the check plate window is made sufficiently large to provide a completely planar surface for the probe tip having a periphery extending beyond any anticipated travel of the probe tip.

In another alternate embodiment of the invention, the invention includes a substantially planar plate having an upper substantially conductive first contact surface thereon defining the first testing device and an aperture for receiving second and third testing devices, the aperture being surrounded by a downward directed taper on the contact surface of the plate adjacent to the aperture.

DETAILED DESCRIPTION OF THE PREFERRED EMBODIMENTS

Figure 1:
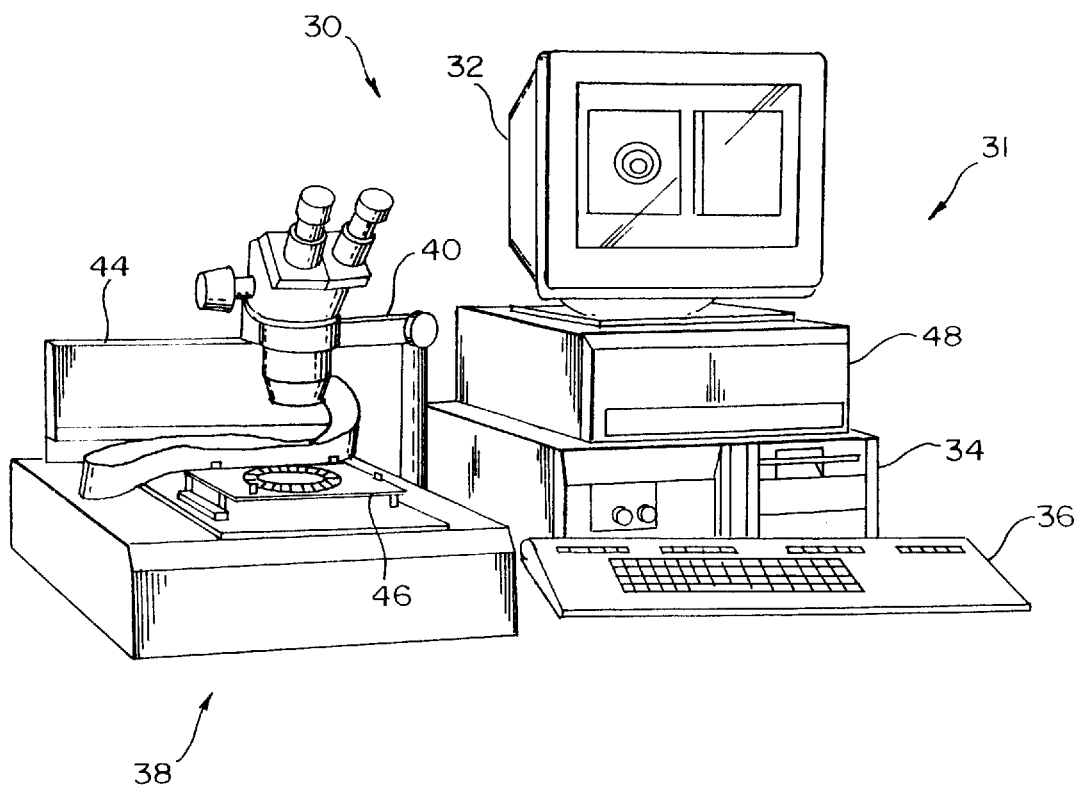
FIG. 1 is an isometric, environmental view of a probe card array analysis and rework station.
Figure 2:
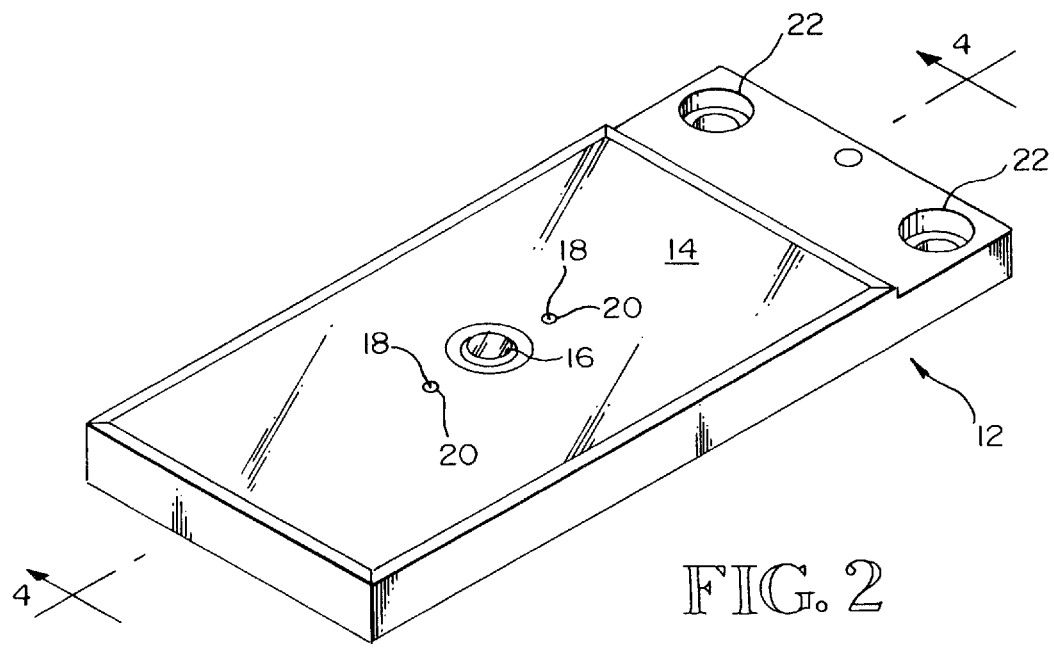
FIG. 2 is an isometric view of a check plate employing the transition zones of the present invention.

A check plate embodying the concepts of the present invention is generally indicated at reference number 12 in FIG. 2. The check plate has a substantially rectangular shape and is preferably manufactured from a rigid material such as tungsten carbide. The check plate is provided with a tungsten carbide, upper contact surface 14 for performing planarity tests of probe tips on a probe card. The contact surface is preferably polished and lapped to a tolerance of 11-millionths of an inch. The check plate is also provided with a circular, relatively large optical window 16 which permits a probe tip to be viewed from beneath the check plate. Two conductive posts 18 are positioned closely adjacent to the optical window along a line which longitudinally bisects the check plate 12 and contains the optical window 16. Although the posts themselves are conductive, they are surrounded by insulating collars 20 to electrically isolate the posts from the contact surface 14 of the check plate. The conductive posts are preferably sized so that only a single probe tip can reside thereon thereby electrically insulating that probe tip from other bussed probe tips which may be in contact with the contact surface 14 of the check plate 12. The check plate is further provided with mounting apertures 22 to permit the check plate to be mounted in a probe card test and rework station generally indicated and reference number 30 in FIG. 1. Each rework station consists of a personal computer 31, monitor 32, central processing unit 34 and keyboard 36 operatively interconnected with a work station generally indicated at reference numeral 38. The work station includes a stereoscopic zoom microscope 40, an input output module 44, and a planarization mother board 46 for accepting a probe card array to be tested.

Figure 3:
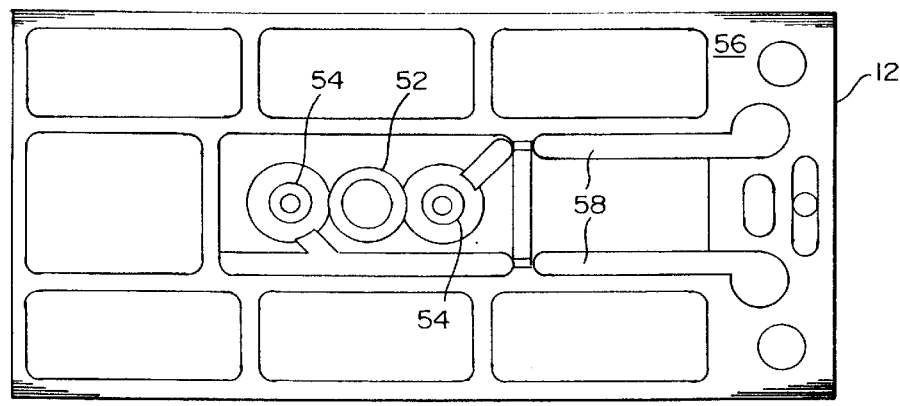
FIG. 3 is a bottom plan view of the check plate of FIG. 2.
Figure 4:
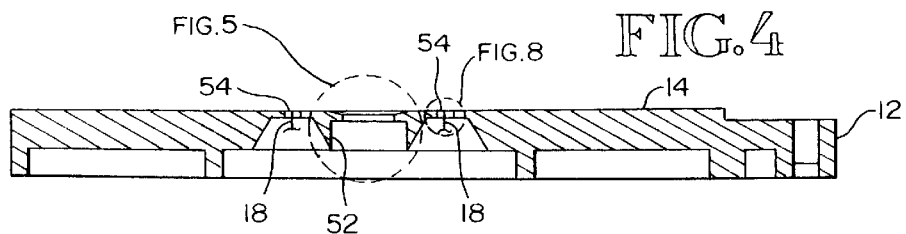
FIG. 4 is a sectional, side elevational view taken along line 4—4 of FIG. 2.

The check plate 12 of FIG. 2 is housed within the work station 38 beneath the mother board 46 and is driven in three orthogonal directions by precision, electromechanical manipulators (not shown). These manipulators, and the electrical stimuli which are transmitted through the probe card (not shown) and the check plate 12 are managed by an electronic driver system 48 which is operatively interconnected with the work station 38 and personal computer 31. An appropriate probe card test and rework station 30 is available from the assignee of the present invention under the trademark Precision Point™. In use, a probe card array is received on the mother board 46 above the check plate 12. A series of tests can be conducted relating to the electrical characteristics of each probe (resistance and impedance); the x-axis, y-axis, and z-axis positions of each probe tip with respect to one another both at touch down of the probe tip on the check plate 12, and after a predetermined degree of over travel to simulate "scrub" on a contact pad of a semi-conductor die; and, force oil the probe. Relative position information regarding the probe tips along the z-axis is obtained by raising the check plate 12 in small increments along the z-axis until each probe tip contacts the contact surface 14 of the check plate 12. This contact surface is in electrical continuity with the probe of interest by way of a multiplexer in the work station 38. This measurement is made for each probe tip in the probe card array and is stored in the memory of the personal computer 31. To determine the relative positioning of the probe tips in the horizontal plane, the check plate is moved in the x and y axes so that one or more probes are positioned over the optical window 16. The optical window has a diameter for approximately 0.140 inch. Typical probe spacing is on the order of 6- to 7-thousandths of an inch with a typical probe tip having a diameter of 0.5- to 2-thousandths of an inch. Therefore, a plurality of probe tips can be positioned over the optical window simultaneously. The work station 38 has a charge coupled device (CCD) camera positioned beneath the window so that a digitized image of a group of probe tips can be obtained when the check plate 12 is raised to come into contact with the probe tips. This digitized information is stored in the personal computer 31 and used to provide the operator with information regarding the degree to which probe tips should be moved in the x, y, or z directions to bring the probe card within specification. As best seen in FIGS. 3 and 4, the check plate 12 is provided with apertures 52 and 54 for receiving the optical window 16, and conductive posts respectively. The underside 56 of the check plate 12 is provide with passageways 58 for conductors (not shown) for the conductive posts.

Figure 5:
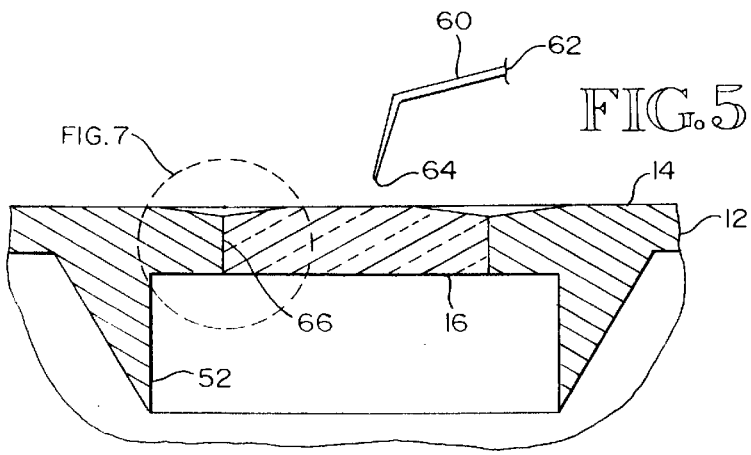
FIG. 5 is an enlarged, sectional view of circled area 5 in FIG. 4.
Figure 7:
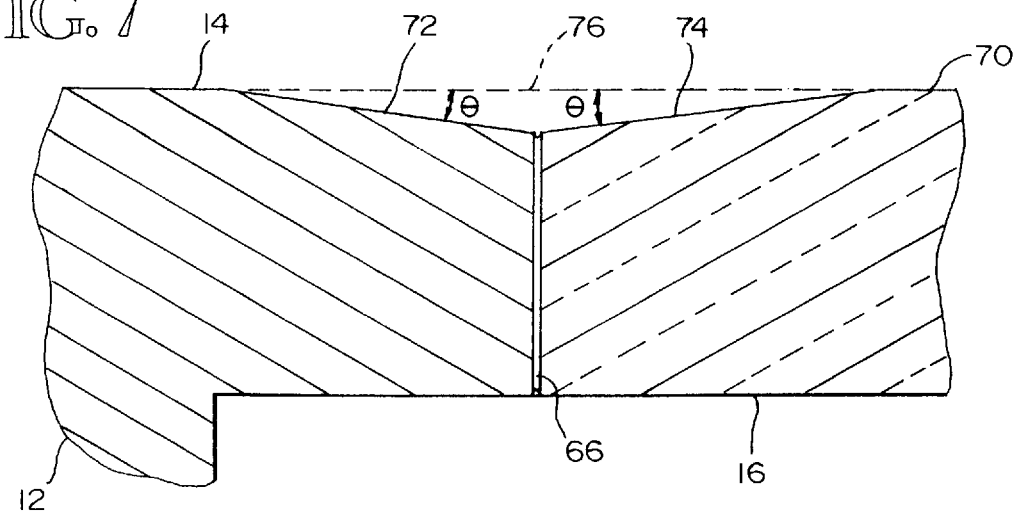
FIG. 7 is a partial, sectional elevational view of circled area 7 in FIG. 5.
Figure 8:
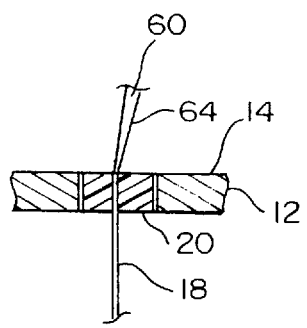
FIG. 8 is a greatly enlarged sectional, side elevational view of circled area 8 in FIG. 4.

As shown in FIG. 5, and FIG. 7, the aperture 52 is sized to closely receive the optical window 16. It is apparent that an electrical probe 60 has a configuration similar to a bent index finger. Probes are typically manufactured from tungsten wire and have a diameter which decreases from a root portion 62 of the probe to a tip portion 64 of the probe.

Figure 6:
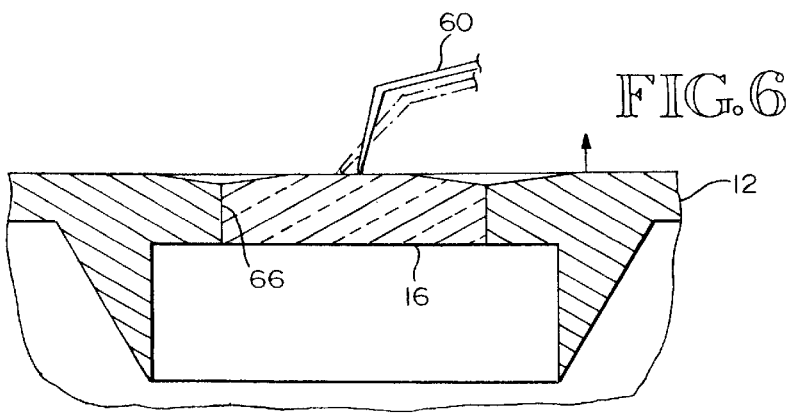
FIG. 6 is a partial, sectional elevational view similar to FIG. 5 showing the invention in use with a probe in a touch down position shown in solid lines, and in a scrub position shown in phantom.

As best seen in FIG. 6, during a scrub test the check plate 12 is moved upwardly against the probe 60 a predetermined distance to measure the deflection of the probe as shown in phantom. Strain gauges (not shown) determine the force which the probe produces under deflection. As shown in FIG. 6, a probe tip which is well aligned in the horizontal plane will remain substantially within the dimensions of the window during the test. However, a badly aligned probe could begin the scrub test near a junction 66 between the optical window 16 and the check plate 12. This junction forms a gap of approximately 0.001 inch. As shown in greater detail in FIG. 7, the gap at junction 66 is filled with an ultra violet cured epoxy which is less durable than the tungsten carbide contact surface 14 of the check plate 12 or the contact surface 70 of the optical window 16. The optical window is preferably manufactured from an anisotropic crystalline synthetic sapphire, is very hard and has a flatness polished to a quarter wave length at 632.8 nanometers over the central, substantially planar contact surface 70. The insulating collars 20 are preferably manufactured from zirconium. Repeated entry of a probe tip into the epoxy junction however can damage the epoxy creating a trap for the probe. Should the same or a subsequently tested probe tip fall into the damaged area, it may become trapped and bent as the check plate is moved in the vertical direction causing probe tip scrub in the horizontal plane.

In view of the above, the check plate 12 of the present invention is provided with downwardly tapered portions 72 and upwardly tapered portions 74 to provide a smooth transition between a first testing surface defined by the upper contact surface 14 of the check plate 12, and a second testing surface defined by the contact surface 70 of the optical window 16, respectively. With respect to a continued projection 76 of the adjacent contact surfaces, the tapered portions define angles theta of approximately 7.4 degrees. This recess performs two principle functions. Firstly, should a substantially out of alignment probe tip move toward the epoxied junction 66 it will be provided with additional landscape over which to travel due to the taper thereby avoiding the junction. Secondly, a probe tip which is poorly aligned in the vertical direction will not suffer stress damage due to vertical over travel because of the relief provided by the taper. For probes having conventional tip diameters in the range of 0.5- to 2-thousandths of an inch, and on center distances of 6- to 7-thousandths of an inch between probes, the tapers shown in FIG. 7 have a preferred depth or rise in the range of approximately 0.010 to 0.013 inch, and a length or run in the range of approximately 0.0775 to 0.0875 inch. Additionally, the depth of the taper should exceed the anticipated vertical over travel of the check plate 12. Finally, the degree of taper is limited by the relationship between the coefficient of static friction of the tungsten probe tip and the zirconium and/or sapphire material. That is, the slope of the taper has been selected so that the gravitational bias in the direction of the taper is less than the static frictional force considering the material types. In this way, the probe tip is not subjected to any gravitational bias forces and behaves as if it is on a horizontal surface. Those of ordinary skill in the art will of course appreciate that the recited ranges of rise and run are related to the material types involved, the diameter and flex characteristic of the particular type of probe under examination and will be able to vary these ranges appropriately in accordance with this disclosure. For example, both of the tapers 72, 74 are shown as being substantially straight. It has been discovered that polishing the taper 74 on the optical window to a spherical section facilitates manufacturing.

Figure 9:
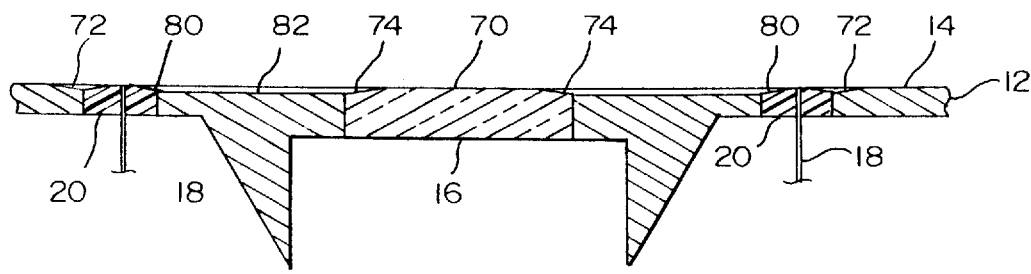
FIG. 9 is a partial, sectional side elevational view of an alternate embodiment of the invention.

As best seen in FIG. 9, the insulating collars 20 surrounding the conductive posts 18 can also be provided with upwardly tapered portions 80 similar to the tapered portion 74 on the optical window 16. Such a configuration is particularly advantageous where the conductive posts 18 are positioned in a relatively close proximity to the optical window 16 as shown as FIG. 9. Such closeness is highly desirable in that less horizontal movement of the check plate 12 is required to transition from an optical comparison of x-y position conducted at the optical window 16, and an electrically isolated test of a single bussed probe at one of the posts 18. By way of illustration, the embodiment shown in FIG. 9 places the conductive posts 18 at an on-center distance of approximately 0.350 inch with respect to the center of the optical window. It is therefore not possible geometrically to provide upwardly tapered portions on the check plate 12 between the optical window and insulating collar 20 with a substantially planar section in between. Therefore, the check plate 12 is provided with a low, relieved area 82 coincident with the ends of the tapers 80, 74 on the collar 20 and optical window 16 respectively.

Figure 10:
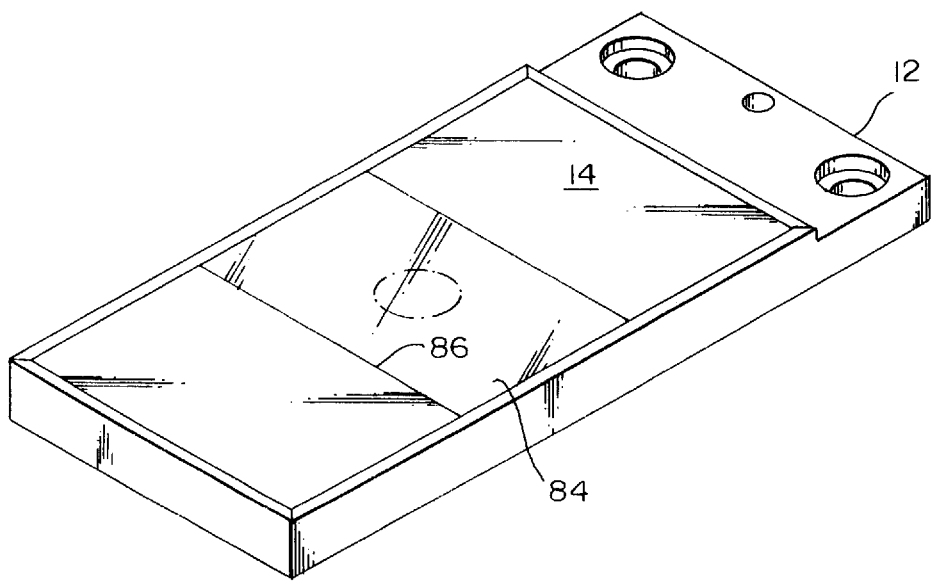
FIG. 10 is an isometric, environmental view of a second, alternate embodiment of the invention.

A second alternate embodiment of the invention is shown in FIG. 10 in which the optical window 84 has been enlarged to a rectangular shape which is larger than the anticipated dimensions of the entire array of probe tips which could be positioned above the window. The dimensions of the window are large enough so that even during an over travel test a badly misaligned probe tip is not likely to encounter the junction 86 between the optical window and the contact surface 14 of the check plate. Nevertheless, the window 84 can be provided with bevels in accordance with the description of the previous embodiments.

Other embodiments and variations of the invention, in accordance with the spirit of this disclosure will be contemplated by those of ordinary skill in the relevant art. Therefore, the invention is not to be limited by the above description, but should be determined in scope by the claims which follow.

I claim:

1. A check plate for testing semiconductor probe card, comprising:

a substantially planar plate having an upper substantially conductive first contact surface thereon defining a first testing device, the plate further defining an aperture for receiving a second testing device;

a second testing device received in the aperture, the second testing device having a substantially planar upper second contact surface thereon; and, a transition zone at an interface between the first and second contact surfaces having a downwardly directed taper on the first contact surface adjacent to the aperture and an upwardly directed taper on the second contact surface at a perimeter thereof.

2. The check plate of claim 1, wherein the tapers define angles of approximately 7.4 degrees with respect to the contact surfaces.

3. The check plate of claim 1, wherein the tapers are substantially straight.

4. The check plate of claim 1, wherein the upwardly directed taper on the second contact surface is substantially curved.

5. The check plate of claim 1, wherein either taper has a rise in the range of approximately 0.010–0.013 inch.

6. The check plate of claim 5, wherein one of the tapers has a run in the range of approximately 0.0775–0.0875 inch.

7. The check plate of claim 1, wherein the second testing device is a non-conductive optical window.

8. The check plate of claim 7, wherein the optical window is manufactured from crystalline synthetic saphire material.

9. The check plate of claim 1, wherein the second testing device is a composite device having an annular substantially insulating collar having the upwardly directed taper thereon and a conductive post contained by the collar and having the second planar contact surface thereon so that a probe of said probe card in contact with the second contact surface is electrically isolated from the first contact surface on the plate.

10. The check plate of claim 9, wherein the post is manufactured from tungsten carbide material, and the collar is manufactured from zirconium crystal material.

11. A check plate for testing semiconductor probe card, comprising:

a substantially planar plate having an upper substantially conductive first contact surface thereon defining a first testing device and an aperture for receiving a second testing device, the aperture being surrounded by a downwardly directed taper on the first contact surface adjacent to the aperture; and, a second testing device received in the aperture, the second testing device having a substantially planar upper second contact surface thereon and an upwardly directed taper on the second contact at a perimeter thereof and beginning from a terminal portion of the downwardly directed taper of the first testing device so as to form a substantially smooth, continuous transition zone at an interface between the first and second contact surfaces.

12. The check plate of claim 11, wherein the tapers define angles of approximately 7.4 degrees with respect to the contact surfaces.

13. The check plate of claim 12, wherein the tapers are substantially straight.

14. The check plate of claim 11, wherein the upwardly directed taper on the second contact surface is substantially curved.

15. The check plate of claim 11, wherein the tapers have depths in the range of approximately 0.010–0.013 inch.

16. The check plate of claim 15, wherein the tapers run a distance in the range of approximately 0.0775–0.0875 inch.

17. The check plate of claim 11, wherein the second testing device is a non-conductive optical window.

18. The check plate of claim 17, wherein the optical window is manufactured from synthetic saphire material.

19. The check plate of claim 11, wherein the second testing device is a composite device having an annular substantially insulating collar having the upwardly directed taper thereon and a conductive post contained by the collar and having the second planar contact surface thereon so that a probe of said probe card in contact with the second contact surface is electrically isolated from the first contact surface on the plate.

20. The check plate of claim 19, wherein the post is manufactured from tungsten carbide material, and the collar is manufactured from zirconium crystal material.

21. A check plate for testing semiconductor probe card, comprising:

a substantially planar plate having an upper substantially conductive first contact surface thereon defining a first testing device and an aperture for receiving second and third testing devices, the aperture being surrounded by a downwardly directed taper on the first contact surface adjacent to the aperture;

a second testing device having a non-conductive optical window received in the aperture, the optical window having a substantially planar upper second contact surface thereon and an upwardly directed taper on the second contact surface at a perimeter thereof;

a third device also received in the aperture having an annular substantially insulating collar having an upwardly directed taper thereon and a conductive post contained by the collar having a third planar contact surface thereon so that a probe in contact with the third contact surface is electrically isolated from the first contact surface on the plate; and, a relatively low level surface between the second and third testing devices conjoined with the tapers so as to form a substantially smooth, continuous transition zone at an interface between the first, second and third contact surfaces.

* * * * *